(12) United States Patent
Baek et al.

(10) Patent No.: US 12,477,921 B2
(45) Date of Patent: Nov. 18, 2025

(54) DISPLAY DEVICE AND MANUFACTURING METHOD THEREOF

(71) Applicant: Samsung Display Co., LTD., Yongin-si (KR)

(72) Inventors: Moon Jung Baek, Seoul (KR); Young Min Kim, Asan-si (KR); Hyeong Gyu Kim, Hwaseong-si (KR); Hyun Woo Noh, Yongin-si (KR); Keun Young Park, Suwon-si (KR); Su Ji Han, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 425 days.

(21) Appl. No.: 17/959,115

(22) Filed: Oct. 3, 2022

(65) Prior Publication Data
US 2023/0110227 A1 Apr. 13, 2023

(30) Foreign Application Priority Data

Oct. 7, 2021 (KR) .......................... 10-2021-0133326

(51) Int. Cl.
*H10K 30/87* (2023.01)
*H10K 50/842* (2023.01)
(Continued)

(52) U.S. Cl.
CPC .......... *H10K 59/38* (2023.02); *H10K 50/844* (2023.02); *H10K 50/86* (2023.02); *H10K 71/00* (2023.02);
(Continued)

(58) Field of Classification Search
CPC .. H10K 50/844; H10K 50/86; H10K 50/8426; H10K 59/38; H10K 59/12;
(Continued)

(56) References Cited

U.S. PATENT DOCUMENTS

| 2017/0146855 A1* | 5/2017 | Park .................. G02F 1/133514 |
| 2018/0182814 A1* | 6/2018 | Kim .................... H10K 59/8792 |

(Continued)

FOREIGN PATENT DOCUMENTS

| JP | 2020-140208 A | 9/2020 |
| JP | 2020-154319 A | 9/2020 |

(Continued)

OTHER PUBLICATIONS

Japanese Office Action dated Sep. 24, 2025, issued in corresponding Japanese Patent Application No. 2022-068813 (4 pages).

*Primary Examiner* — Omar F Mojaddedi
(74) *Attorney, Agent, or Firm* — Womble Bond Dickinson (US) LLP

(57) ABSTRACT

A display device including: a unit pixel area including a light blocking area on a substrate comprising a first light blocking area and a second light blocking area, the first pixel area comprises: a first color conversion layer on a light emitting element; and a first color filter on the first color conversion layer, the second pixel area comprises: a second color conversion layer on the light emitting element; and a second color filer on the second color conversion layer, the third pixel area comprises: a transmissive layer on the light emitting element; and a third color filter on the transmissive layer, the first light blocking area overlaps the first color filter, the second color filter, and the third color filter, and the second light blocking area overlaps two color filters selected from the first color filter, the second color filter, and the third color filter.

11 Claims, 14 Drawing Sheets

(51) Int. Cl.
*H10K 50/844* (2023.01)
*H10K 50/86* (2023.01)
*H10K 59/12* (2023.01)
*H10K 59/38* (2023.01)
*H10K 71/00* (2023.01)

(52) U.S. Cl.
CPC ......... *H10K 59/12* (2023.02); *H10K 59/1201* (2023.02)

(58) Field of Classification Search
CPC ........... H10K 59/1201; H10K 59/8792; H10K 30/87; H10K 71/00
See application file for complete search history.

(56) References Cited

U.S. PATENT DOCUMENTS

| | | | |
|---|---|---|---|
| 2018/0321764 A1* | 11/2018 | Oh | ........................ H10K 50/844 |
| 2019/0147812 A1 | 5/2019 | Koudo et al. | |
| 2019/0206945 A1* | 7/2019 | Lin | .................... H10K 59/8052 |
| 2020/0091247 A1* | 3/2020 | Lee | ........................ H10K 59/40 |
| 2020/0119113 A1* | 4/2020 | Lee | ........................ H10K 50/858 |
| 2020/0212111 A1 | 7/2020 | Kim et al. | |
| 2020/0273929 A1 | 8/2020 | Kim et al. | |
| 2020/0388663 A1 | 12/2020 | Lee et al. | |
| 2021/0066643 A1 | 3/2021 | Choi et al. | |
| 2021/0249478 A1 | 8/2021 | Oh et al. | |

FOREIGN PATENT DOCUMENTS

| | | |
|---|---|---|
| JP | 2021-503626 A | 2/2021 |
| KR | 10-2017-0031613 A | 3/2017 |
| KR | 10-2018-0036320 A | 4/2018 |
| KR | 10-2018-0073194 A | 7/2018 |
| KR | 10-2020-0031748 A | 3/2020 |
| KR | 10-2020-0080729 A | 7/2020 |
| KR | 10-2020-0140966 A | 12/2020 |
| KR | 10-2021-0101380 A | 8/2021 |

* cited by examiner

DISPLAY DEVICE AND MANUFACTURING METHOD THEREOF

CROSS-REFERENCE TO RELATED APPLICATION

The present application claims priority to and the benefit of Korean Patent Application No. 10-2021-0133326 filed in the Korean Intellectual Property Office on Oct. 7, 2021, the entire content of which is hereby incorporated by reference.

BACKGROUND

1. Field

Aspects of some embodiments of the present disclosure relate to a display device and a manufacturing method of the display device.

2. Description of the Related Art

A display device including a color conversion layer using a semiconductor nanocrystal such as a quantum dot may reduce light loss caused by color filters and to implement a display device with relatively high color reproducibility.

The above information disclosed in this Background section is only for enhancement of understanding of the background and therefore the information discussed in this Background section does not necessarily constitute prior art.

SUMMARY

Aspects of some embodiments according to the present disclosure may include a display device including an overcoat layer with relatively improved flatness, and a method for manufacturing the display device.

A display device according to some embodiments includes a unit pixel area including a first pixel area, a second pixel area, a third pixel area, and a light blocking area on a substrate, wherein the light blocking area includes a first light blocking area and a second light blocking area, the first pixel area includes a first color conversion layer positioned on a light emitting element and a first color filter on the first color conversion layer, the second pixel area includes a second color conversion layer positioned on the light emitting element, and a second color filer positioned on the second color conversion layer, the third pixel area includes a transmissive layer positioned on the light emitting element and a third color filter positioned on the transmissive layer, the first light blocking area overlaps the first color filter, the second color filter, and the third color filter, and the second light blocking area overlaps two color filters selected from the first color filter, the second color filter, and the third color filter.

According to some embodiments, in the unit pixel area, an area occupied by the first light blocking area may be smaller than an area occupied by the second light blocking area.

According to some embodiments, the first light blocking area may be between the first pixel area and the second pixel area adjacent to each other and between the second pixel area and the third pixel area that are adjacent to each other in the unit pixel area.

According to some embodiments, the first pixel area, the second pixel area, and the third pixel area may be arranged along a first direction.

According to some embodiments, the unit pixel area includes at least two second light blocking areas, and the second light blocking area, the first pixel area, and the second light blocking area may be arranged along a second direction.

According to some embodiments, the first color filter may include an opening that overlaps the second pixel area and the third pixel area.

According to some embodiments, the second color filter may include: a 2-1 opening overlapping the first pixel area; a 2-2 opening overlapping the third pixel area; and a 2-3 opening overlapping the second light blocking area.

According to some embodiments, the third color filter may include an opening that overlaps the first pixel area and the second pixel area.

According to some embodiments, a thickness of the first light blocking area may be different from a thickness of the second light blocking area.

According to some embodiments, a thickness of the first light blocking area may be larger than a thickness of the second light blocking area.

According to some embodiments, the display device may further include an overcoat layer that is positioned on the first color filter, the second color filter, and the third color filter, and a cover window that is positioned on the overcoat layer.

A display device according to some embodiments includes a unit pixel area that is iteratively arranged on a substrate, wherein the unit pixel area includes a pixel area and a light blocking area, the light blocking area includes a first light blocking area and a second light blocking area, and the pixel area includes: a first pixel area that includes a first color filter positioned on a first color conversion layer; a second pixel area that includes a second color filter positioned on a second color conversion layer; and a third pixel area that includes a third color filter positioned on a transmissive layer, the first light blocking area and the second light blocking area overlap two or more of the first color filter, the second color filter, and the third color filter, and a thickness of the first light blocking area is different from a thickness of the second light blocking area.

A manufacturing method of a display device, according to some embodiments includes forming a unit pixel area that is iteratively arranged on a substrate, wherein the unit pixel area includes a pixel area and a light blocking area, the light blocking area comprises a first light blocking area and a second light blocking area, the first light blocking area is formed by overlapping a first color filter, a second color filter, and a third color filter, the second light blocking area is formed by overlapping a first color filter and a third color filter, and a thickness of the first light blocking area is formed to be larger than a thickness of the second light blocking area.

According to some embodiments, a display device including an overcoat layer with relatively improved flatness, and a method for manufacturing the display device can be provided.

DETAILED DESCRIPTION

Figure 1:
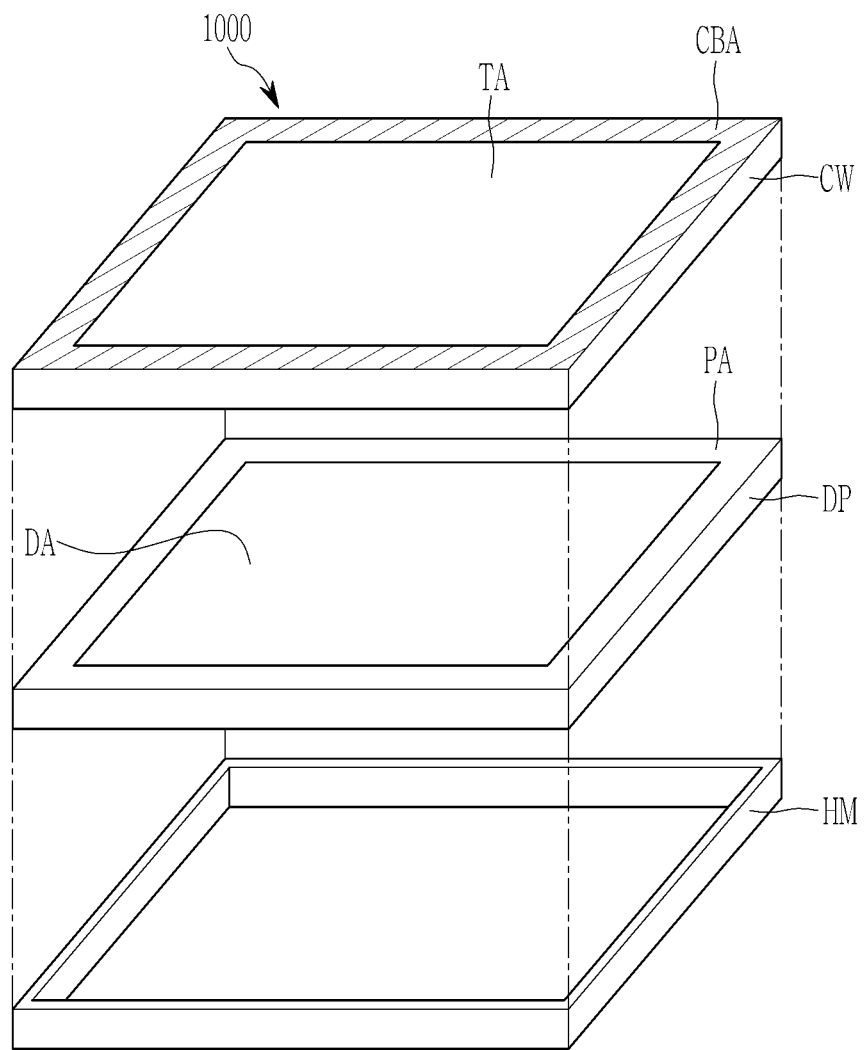
FIG. 1 is a schematic exploded perspective view of a display device according to some embodiments.
Figure 1:
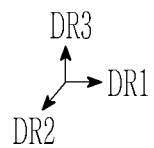

Aspects of some embodiments of the present invention will be described more fully hereinafter with reference to the accompanying drawings, in which some embodiments of the invention are shown. As those skilled in the art would realize, the described embodiments may be modified in various different ways.

The drawings and description are to be regarded as illustrative in nature and not restrictive. Like reference numerals designate like elements throughout the specification.

In addition, since the size and thickness of each configuration shown in the drawings are arbitrarily indicated for better understanding and ease of description, the present invention is not necessarily limited to the drawings. In the drawings, the thickness of layers, films, panels, regions, etc., are exaggerated for clarity. In addition, in the drawings, the thickness of some layers and regions is exaggerated for better understanding and ease of description.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, throughout the specification, the word "on" a target element will be understood to mean positioned above or below the target element, and will not necessarily be understood to mean positioned "at an upper side" based on an opposite to gravity direction.

In addition, unless explicitly described to the contrary, the word "comprise", and variations such as "comprises" or "comprising", will be understood to imply the inclusion of stated elements but not the exclusion of any other elements.

Further, throughout the specification, the phrase "on a plane" means viewing a target portion from the top, and the phrase "on a cross-section" means viewing a cross-section formed by vertically cutting a target portion from the side.

Hereinafter, a display device according to some embodiments will be described in more detail with reference to FIG. 1. FIG. 1 is a schematic exploded perspective view of a display device according to some embodiments.

Referring to FIG. 1, a display device according to some embodiments may include a cover window CW, a display panel DP, and a housing HM.

The cover window CW may include an insulating panel. For example, the cover window CW may be formed of glass, plastic, or a combination thereof.

A front side of the cover window CW may define a front side of the display device 1000. The transmissive area TA may be an optically transparent region. For example, the transmissive area TA may be a region having a visible ray transmittance of about 90% or more.

The blocking area BA may define the shape of the transmissive area TA. The blocking area BA is adjacent to the transmissive area TA and may surround the transmissive area TA. The blocking area BA may be a region having relatively low light transmittance compared to the transmissive area TA. The blocking area BA may include a transparent material that blocks light. The blocking area BA may have a predetermined color. The blocking area BA may be defined by a bezel layer provided separately from a transparent substrate defining the transmissive area TA, or may be defined by an ink layer formed by being inserted or coloring the transparent substrate.

One side of the display panel DP where the image is displayed is parallel to a side defined by a first direction DR1 and a second direction DR2. A third direction DR3 indicates a normal direction of one side where the image is displayed, that is, a thickness direction of the display panel DP. The front (or top) and back (or bottom) sides of each member are separated by the third direction DR3. However, the directions indicated by the first to third directions DR1, DR2, and DR3 are relative concepts and may be converted to other directions.

The display panel DP may be a flat rigid display panel, but embodiments according to the present disclosure are not limited thereto, and according to some embodiments, the display panel DP may be a flexible display panel. On the other hand, the display panel DP may be formed of an organic light emitting panel. However, the type of display panel DP is not limited thereto, and various types of panels may be used. For example, the display panel DP may be formed of a liquid crystal panel, an electrophoretic display panel, an electrowetting display panel, and the like. In addition, the display panel DP may be formed of the next generation display panel such as a micro light emitting diode display panel, a quantum dot light emitting diode display panel, and a quantum dot organic light emitting diode (OLED) display panel.

The micro light emitting diode (LED) display panel is formed of pixels, each formed of 10 to 100 micrometer size light emitting diodes. Such a micro light emitting diode display panel uses inorganic materials, backlight can be omitted, reaction speed is fast, high luminance can be realized with low power, and when being bent, damage to the display panel can be prevented or reduced. The quantum dot light emitting diode display panel is formed by attaching a film containing quantum dots or forming a material containing quantum dots. "Quantum dot" refers to particles made of inorganic materials such as indium and cadmium, which emit light by themselves, and have a diameter of several nanometers or less. Light of a desired color can be displayed by controlling the particle size of the quantum dot. The quantum dot organic light emitting diode display panel uses a blue organic light emitting diode as a light source, and a film containing red and green quantum dots is attached on it, or a material containing red and green quantum dots is deposited to realize the color. The display panel DP according to some embodiments can be formed of various other display panels.

As shown in FIG. 1, the display panel DP includes a display area DA where images are displayed, and a peripheral area PA adjacent to the display area DA. The peripheral area PA is a region where no images are displayed. The display area DA may have, for example, a rectangular shape, and the peripheral area PA may have a shape surrounding the display area DA. However, embodiments according to the present invention are not limited thereto, and the shapes of the display area DA and the peripheral area PA may be relatively designed.

The housing HM provides an internal space (e.g., a set or predetermined internal space). The display panel DP is mounted inside the housing HM. In addition to the display panel DP, various electronic components such as a power supply, a storage device, and a sound input and output module can be mounted inside the housing HM.

Figure 2:
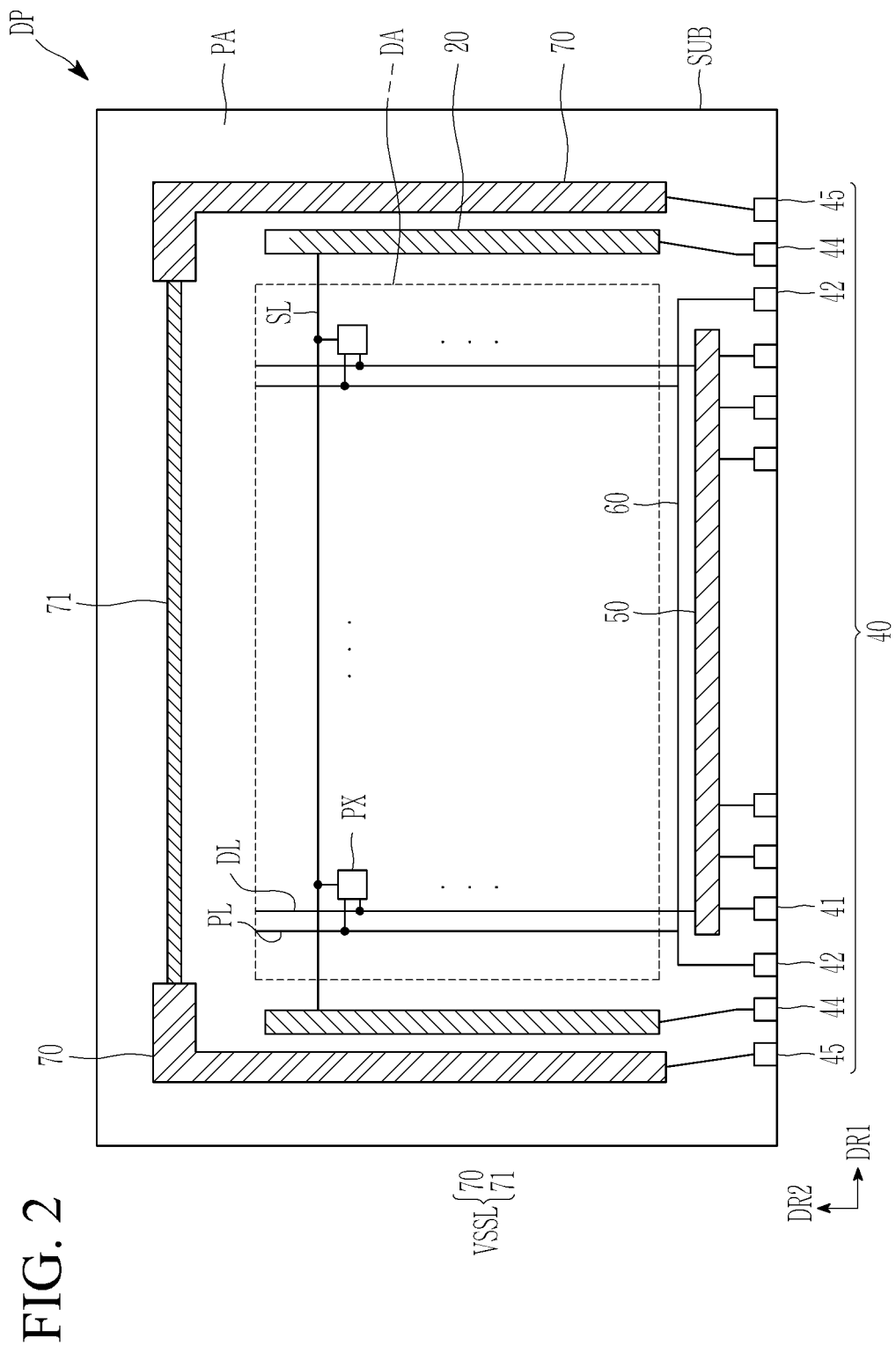
FIG. 2 is a top plan view of some area of the display panel according to some embodiments.

Hereinafter, the display panel according to some embodiments will be described with reference to FIG. 2. FIG. 2 is a top plan view of some area of the display panel according to some embodiments.

Referring to FIG. 2, the display panel DP includes a display area DA and a peripheral area PA. The peripheral area PA may be defined along the edge of the display area DA.

The display panel DP includes a plurality of pixels PX. The plurality of pixels PX may be located in the display area DA on the substrate SUB. Each pixel PX includes an organic light emitting diode (OLED) and a pixel driving circuit connected to the organic light emitting diode OLED.

Each pixel PX emits light of, for example, red, green, and blue, or white, and may include, for example, an organic light emitting diode. The display panel DP provides a predetermined image through the light emitted from the pixel PXs, and the display area DA is defined by the pixels PX. In the present specification, the peripheral area PA is a region where pixels PX are not located, and indicates a region that does not display images.

The display panel DP may include a plurality of signal lines and a pad portion. A plurality of signal lines may include a scan line SL extending in a first direction DR1, a data line DL and a driving voltage line PL extending in a second direction DR2, and the like.

The scan driver 20 is positioned in the peripheral area PA on the substrate SUB. The scan driver 20 generates and transmits a scan signal to each pixel PX through the scan line SL. Depending on embodiments, the scan driver 20 may be located at the left side and the right side of the display area DA (and/or the top and/or the bottom side of the display area DA). According to some embodiments, the scan driver 20 may be arranged at opposite sides of the display area DA (or various sides of the display area DA), but according to some embodiments, the scan driver 20 may be located only at one side of the display area DA.

The pad portion 40 is located at one end of the display panel DP, and includes a plurality of terminals 41, 42, 44, and 45. The pad portion 40 is exposed rather than being covered by an insulation layer, and thus may be electrically connected with a flexible printed circuit board or a controller such as an IC chip.

The controller changes a plurality of externally transmitted video signals, and transmits the changed signals to the data driver 50 through the terminal 41. In addition, the controller receives a vertical synchronization signal, a horizontal synchronization signal, and a clock signal, and generates control signals for controlling driving of the scan driver 20 and the data driver 50 and transmits the generated signals respectively through the terminals 44 and 41. The controller transmits the driving voltage ELVDD to the driving voltage supply line 60 through the terminal 42. The controller also transmits a common voltage to each of the common voltage supply lines VSSL through terminal 45.

The data driver 50 is located on the peripheral area PA, and generates and transmits a data signal to each pixel PX through the data line DL. The data driver 50 may be located on one side of the display panel DP, and may be located between the pad portion 40 and the display portion 10 for example.

The driving voltage supply line 60 is located at the peripheral area PA. For example, the driving voltage supply line 60 may be located between the data driver 50 and the display area DA. The driving voltage supply line 60 provides a driving voltage to the pixel PX. The driving voltage supply line 60 may be located in the first direction DR1 and may be connected to a plurality of driving voltage lines PL located in the second direction DR2.

The common voltage supply line VSSL is located on the peripheral area PA and provides the common voltage to a common electrode of the organic light emitting element of the pixel PX. The common voltage supply line VSSL may extend from one side of the substrate SUB to form a closed loop surrounding three sides along the edge of the substrate SUB.

The common voltage supply line VSSL may include a main supply line 70 and a sub-supply line 71, and the like.

Figure 3:
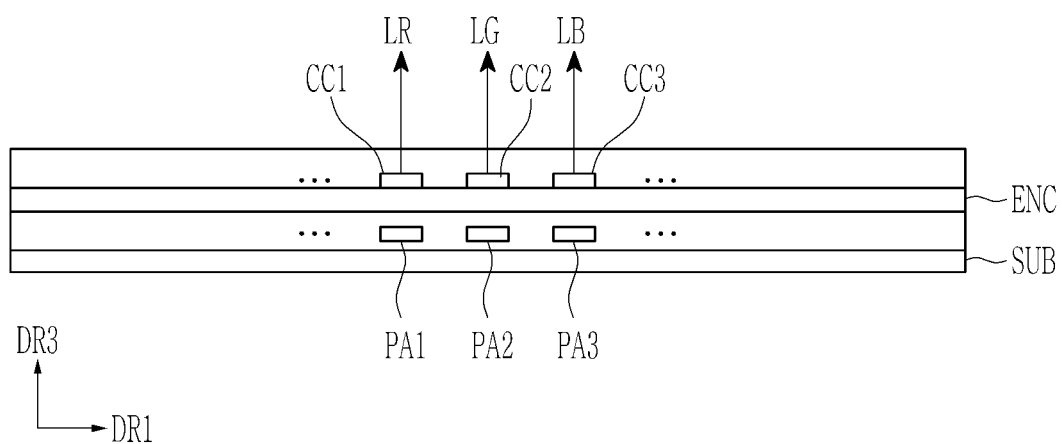
FIG. 3 is a schematic cross-sectional view of a display panel according to some embodiments.
Figure 4:
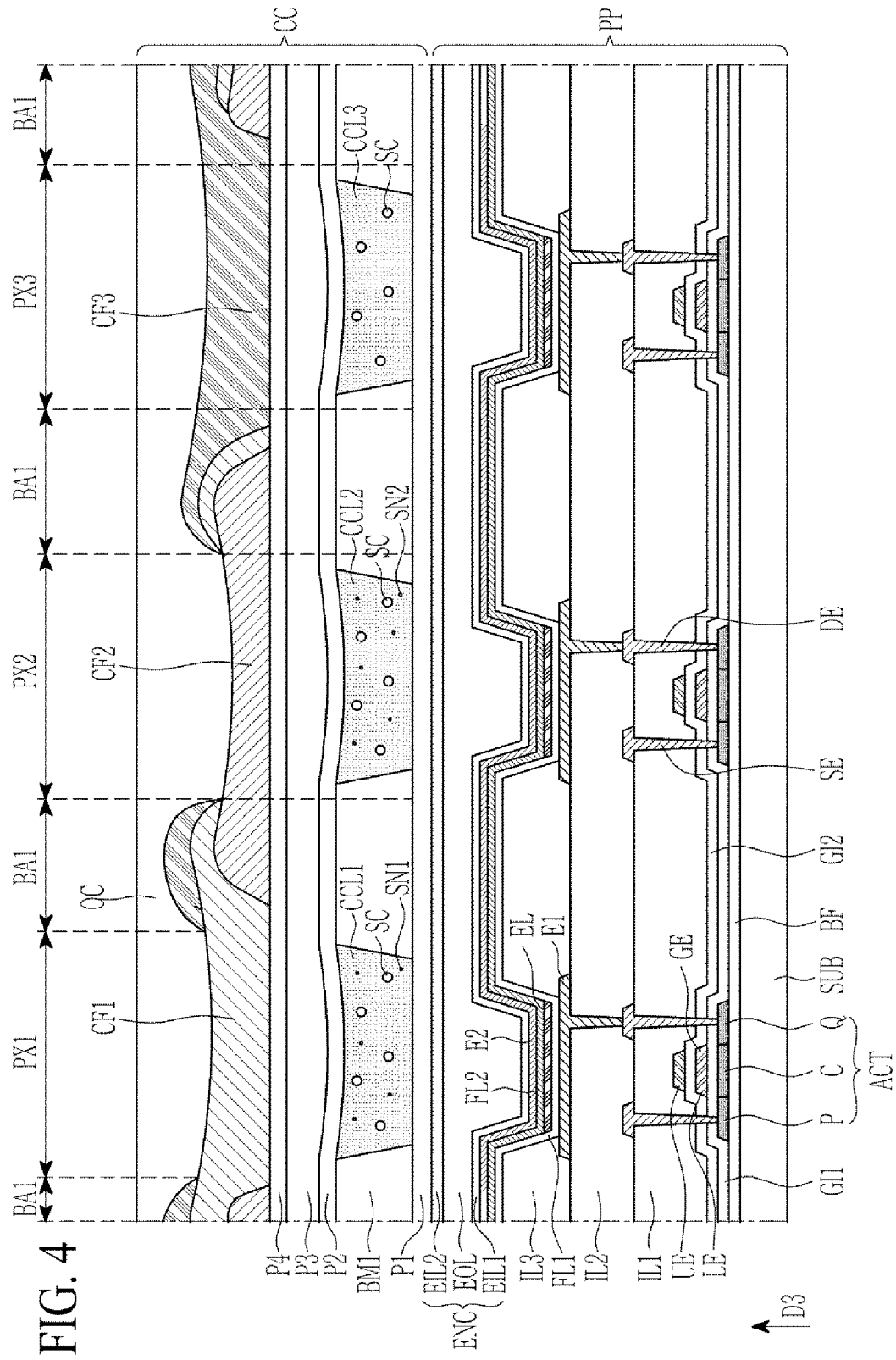
FIG. 4 is a cross-sectional view of a display panel according to some embodiments.

Hereinafter, referring to FIG. 3 to FIG. 4, a display area of a display panel according to some embodiments will be described. FIG. 3 is a schematic cross-sectional view of a display panel according to some embodiments, and FIG. 4 is a cross-sectional view of a display panel according to some embodiments.

First, referring to FIG. 3, a plurality of pixels PA1, PA2, and PA3 may be formed on a substrate SUB, which corresponds to a display area DA. Each of the pixels PA1, PA2, and PA3 may include a plurality of transistors and light emitting elements connected thereto.

An encapsulation layer ENC may be positioned on the plurality of pixels PA1, PA2, and PA3. The display area DA can be protected from external air or moisture through the encapsulation layer ENC. The encapsulation layer ENC may be integrally provided to overlap the front surface of the display area DA, and may be partially located at the peripheral area PA.

A first color converter CC1, a second color converter CC2, and a transmissive portion CC3 may be positioned on the encapsulation layer ENC. The first color converter CC1 overlaps the first pixel PA1, the second color converter CC2 overlaps the second pixel PA2, and the transmissive portion CC3 overlaps the third pixel PA3.

Light emitted from the first pixel PA1 may pass through first color converter CC1 to provide red light LR. Light emitted from the second pixel PA2 may pass through the second color converter CC2 to provide green light LG. Light emitted from the third pixel PA3 may pass through the transmissive portion CC3 to provide blue light LB.

Hereinafter, a stacked structure of each of the pixels PA1, PA2, and PA3 and a stacked structure of color converters CC1 and CC2 and a transmissive portion CC3 will be described. Referring to FIG. 4, the color converter CC may be positioned on a pixel portion PP including the first to third pixels PA1, PA2, and PA3.

Referring to FIG. 4, the substrate SUB according to some embodiments may include an inorganic insulating material such as glass or an organic insulating material such as a plastic like a polyimide (PI). The substrate SUB may be single-layered or multi-layered. The substrate SUB may have a structure in which at least one base layer containing a sequentially stacked polymer resin and at least one inorganic layer are alternately stacked.

The substrate SUB may have various degrees of flexibility. The substrate SUB may be a rigid substrate or a flexible substrate capable of bending, folding, or rolling.

A buffer layer BF can be positioned on the substrate SUB. The buffer layer BF blocks the transfer of impurity from the substrate SUB to an upper layer of the buffer layer BF, particularly, a semiconductor layer ACT, thereby preventing or reducing the characteristic degradation of the semiconductor layer ACT and reducing the stress. The buffer layer BF may include an inorganic insulating material or an organic insulating material such as a silicon nitride or a silicon oxide. A part or all of the buffer layer BF may be omitted.

The semiconductor layer ACT is positioned on the buffer layer BF. The semiconductor layer ACT may include at least one of a polysilicon or an oxide semiconductor. The semiconductor layer ACT includes a channel region C, a first region P, and a second region Q. The first region P and second region Q are respectively located on both sides of the channel region C. The channel region C may contain semiconductors doped with a small amount of an impurity or undoped with an impurity, and the first region P and the second region Q may contain semiconductors doped with a large amount of an impurity compared to the channel region C. The semiconductor layer ACT may be formed of an oxide semiconductor. In this case, a separate protective layer may be added to protect the oxide semiconductor material, which is vulnerable to external environments such as a high temperature.

A first gate insulation layer GI1 is located on the semiconductor layer ACT.

A gate electrode GE and a lower electrode LE are positioned on the first gate insulation layer GI1. According to some embodiments, the gate electrode GE and the lower electrode LE may be integrally formed.

The gate electrode GE and the lower electrode LE may be a single layer or multilayers in which a metal film including any one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region C of the semiconductor layer ACT.

A second gate insulation layer GI2 may be positioned on the gate electrode GE and the first gate insulation layer GI1. The first gate insulation layer GI1 and the second gate insulation layer GI2 may be single-layered or multi-layered including at least one of a silicon oxide (SiOx), a silicon nitride (SiNx), or a silicon oxynitride (SiOxNy).

An upper electrode UE may be positioned on the second gate insulation layer GI2. The upper electrode UE may form a storage capacitor while overlapping the lower electrode LE.

A first interlayer insulation layer IL1 is positioned on the upper electrode UE. The first interlayer insulation layer IL1 may be single-layered or multi-layered including at least one of a silicon oxide (SiOx), a silicon nitride (SiNx), or a silicon oxynitride (SiOxNy).

A source electrode SE and a drain electrode DE are positioned on the first interlayer insulation layer IL1. The source electrode SE and the drain electrode DE are respectively connected to the first region P and the second region Q of the semiconductor layer ACT through a contact hole formed in insulation layers.

The source electrode SE and the drain electrode DE may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu), and may be a single-layer or multi-layer structure including the same.

A second interlayer insulation layer IL2 is positioned on the first interlayer insulation layer IL1, the source electrode SE, and the drain electrode DE. The second interlayer insulation layer IL2 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like.

A first electrode E1 may be positioned on the second interlayer insulation layer IL2. The first electrode E1 may be connected with the drain electrode DE through a contact hole of the second interlayer insulation layer IL2.

The first electrode E1 may include a metal such as silver (Ag), lithium (Li), calcium (Ca), aluminum (Al), magnesium (Mg), gold (Au), and the like, and may include a transparent conductive oxide (TCO) such as an indium tin oxide (ITO), an indium zinc oxide (IZO), and the like. The first electrode E1 may be formed of a single layer or a multi-layer including a metallic material or a a transparent conductive oxide. For example, the first electrode E1 may have a triple layer structure of indium tin oxide (ITO)/silver (Ag)/indium tin oxide (ITO).

A transistor formed of the gate electrode GE, the semiconductor layer ACT, the source electrode SE, and the drain electrode DE is connected to the first electrode E1 and supplies a current to a light emitting element.

A partitioning wall IL3 is positioned on the second interlayer insulation layer IL2 and the first electrode E1. According to some embodiments, a spacer may be positioned on the partitioning wall IL3. The partitioning wall IL3 includes an opening that overlaps at least a part of the first electrode E1 and defines a light emitting region.

The partitioning wall IL3 may include an organic insulation material such as a general-purpose polymer such as polymethyl methacrylate (PMMA) or polystyrene (PS), polymer derivatives with phenolic groups, acryl-based polymers, imide-based polymers, polyimides, acryl-based polymers, siloxane-based polymers, and the like.

An emission layer EL is positioned on the first electrode E1. Function layers FL1 and FL2 may be positioned above and below the emission layer EL. The first function layer FL1 includes at least one of a hole injection layer (HIL) or a hole transport layer (HTL), and the second function layer FL2 may be a multilayer including at least one of an electron transport layer (ETL) or an electron injection layer (EIL). The function layers FL1 and FL2 may overlap a front surface of the substrate SUB.

A second electrode E2 is positioned on the function layers FL1 and FL2. The second electrode E2 may include a reflective metal containing calcium (Ca), barium (Ba), magnesium (Mg), aluminum (Al), silver (Ag), gold (Au), nickel (Ni), chromium (Cr), lithium (Li), calcium (Ca), and the like, or a transparent conductive oxide (TCO) such as an indium tin oxide (ITO) or an indium zinc oxide (IZO).

The first electrode E1, the emission layer EL, the function layers FL1 and FL2, and the second electrode E2 may form a light emitting element. Here, the first electrode E1 may be an anode that is a hole injection electrode, and the second electrode E2 may be a cathode that is an electron injection electrode. However, the embodiments are not limited thereto, and the first electrode E1 may become a cathode and the second electrode E2 may become an anode depending on a driving method of the light emitting display device.

Holes and electrons are respectively injected into the emission layer EL from the first electrode E1 and the second electrode E2, and light emission occurs when the excitons combined with the injected holes and electrons fall from an exited state to a ground state.

An encapsulation layer ENC is positioned on the second electrode E2. The encapsulation layer ENC may cover and seal not only a top surface of the light emitting element, but also side surfaces. Since the light emitting element is very vulnerable to moisture and oxygen, the encapsulation layer ENC seals the light emitting element to block the inflow of external moisture and oxygen.

The encapsulation layer ENC may include a plurality of layers, among which the encapsulation layer ENC may be formed as a composite film including both an inorganic layer and an organic layer. For example, the encapsulation layer ENC may be formed as a triple layer in which a first encapsulation layer EIL1, an encapsulation organic layer EOL, and an encapsulation inorganic layer are sequentially formed.

The first encapsulation inorganic layer EIL1 may cover the second electrode E2. The first encapsulation inorganic layer EIL1 may prevent external moisture or oxygen from penetrating into the light emitting element. For example, the first encapsulation inorganic layer EIL1 may include a silicon nitride, a silicon oxide, a silicon oxynitride, or a combination thereof. The first encapsulation inorganic layer EIL1 may be formed through a deposition process.

The encapsulation organic layer EOL may be located on the first encapsulation inorganic layer EIL1 and contact the first encapsulation inorganic layer EIL1. A curve formed on an upper surface of the first encapsulation inorganic layer EIL1 or particles existing on the first encapsulation inorganic layer EIL1 are covered by the encapsulation organic layer EOL, and thus it is possible to block the influence of a surface state of the upper surface of the first encapsulation inorganic layer EIL1 on components formed on the encapsulation organic layer EOL. In addition, the encapsulation organic layer EOL may relieve the stress between the contacting layers. The encapsulation organic layer EOL may contain organic materials and may be formed through a solution process such as spin coating, slit coating, or an inkjet process.

The second encapsulation inorganic layer EIL2 is located on the encapsulation organic layer EOL to cover the encapsulation organic layer EOL. The second encapsulation inorganic layer EIL2 may be stably formed on a relatively flat surface than being located on the first encapsulation inorganic layer EIL1. The second encapsulation inorganic layer EIL2 prevents or reduces flow to the outside by encapsulating moisture emitted from the encapsulation organic layer EOL. The second encapsulation inorganic layer EIL2 may include a silicon nitride, a silicon oxide, a silicon oxynitride, or a combination thereof. The second encapsulation inorganic layer EIL2 may be formed through a deposition process.

According to some embodiments, a capping layer positioned between the second electrode E2 and the encapsulation layer ENC may be further included. The capping layer may include an organic material. The capping layer protects the second electrode E2 from the subsequent sputtering process and improves the light output efficiency of the light emitting element. The capping layer may have a refractive index that is greater than that of the first encapsulation inorganic layer EIL1.

A color converter CC includes a first insulation layer P1 positioned on the pixel portion PP. The first insulation layer P1 may be integrally formed to overlap the entire display area DA. The first insulation layer P1 may be a single layer or multi-layered including at least one of a silicon oxide (SiOx), a silicon nitride (SiNx), or a silicon oxynitride (SiOxNy). Depending on embodiments, the first insulation layer P1 may be omitted.

A first light blocking layer BM1 may be positioned on the first insulation layer P1. The first light blocking layer BM1 may define a region in which a first color conversion layer CCL1, a second color conversion layer CCL2, and a transmissive layer CCL3 are positioned.

The first color conversion layer CCL1, the second color conversion layer CCL2, and the transmissive layer CCL3 are positioned in a region defined by the first light blocking layer BM1. The first color conversion layer CCL1, the second color conversion layer CCL2, and the transmissive layer CCL3 may be formed by an inkjet process, but embodiments are not limited thereto, and may be formed using any manufacturing method.

The transmissive layer CCL3 transmits light of a first wavelength incident from the pixel portion PP, and may include a plurality of scatterers SC. In this case, a maximum light emitting peak wavelength of light of the first wavelength may be blue light of about 380 nm to about 480 nm, for example, about 420 nm or more, about 430 nm or more, about 440 nm or more, or about 445 nm or more, and about, 470 nm or less, about 460 nm or less, or about 455 nm or less.

The first color conversion layer CCL1 may color-convert the light of the first wavelength incident from the pixel portion PP into red light, and may include a plurality of scatterers SC and a plurality of first quantum dots SN1. In this case, the red light may have a maximum light emitting peak wavelength of about 600 nm to about 650 nm, for example, about 620 nm to about 650 nm.

The second color conversion layer CCL2 converts the light of the first wavelength incident from the display panel into green light, and may include a plurality of scatterers SC and a plurality of second quantum dots SN2. The green light may have a maximum light emitting peak wavelength of about 500 nm to about 550 nm, for example, about 510 nm to about 550 nm.

The plurality of scatterers SC may scatter light incident on the first color conversion layer CCL1, the second color conversion layer CCL2, and the transmissive layer CCL3 to increase light efficiency.

The first quantum dot SN1 and the second quantum dots SN2 (hereinafter, also referred to as semiconductor nanocrystals) each may independently include a group II-VI compound, a group III-V compound, a group IV-VI compound, a group IV element or compound, and a I-III-group VI compound, a group II-III-VI compound, a group I-II-IV-VI compound, or a combination thereof. The quantum dots may not contain cadmium.

The group II-VI compound may be selected from a group consisting of a binary compound selected from a group consisting of CdSe, CdTe, ZnS, ZnSe, ZnTe, ZnO, HgS, HgSe, HgTe, MgSe, MgS, and a mixture thereof; a ternary compound selected from a group consisting of AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The II-VI compound may further include a group III metal.

The group III-V compound may be selected from a group consisting of a binary compound selected from a group consisting of GaN, GaP, GaAs, GaSb, AlN, AlP, AlAs, AlSb, InN, InP, InAs, InSb, and a mixture thereof; a ternary compound selected from a group consisting of GaNP, GaNAs, GaNSb, GaPAs, GaPSb, AlNP, AlNAs, AlNSb, AlPAs, AlPSb, InGaP, InNP, InNAs, InNSb, InPAs, InZnP, InPSb, and a mixture thereof; and a quaternary compound selected from a group consisting of GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The III-V compound may further include a group II metal (e.g., InZnP)

The group IV-VI compound may be selected from a group consisting of a binary compound selected from a group consisting of SnS, SnSe, SnTe, PbS, PbSe, PbTe, and a mixture thereof; a ternary compound selected from a group consisting of SnSeS, SnSeTe, SnSTe, PbSeS, PbSeTe, PbSTe, SnPbS, SnPbSe, SnPbTe, and a mixture thereof; and a quaternary compound selected from a group consisting of SnPbSSe, SnPbSeTe, SnPbSTe, and a mixture thereof.

The group IV element or compound is a single element compound selected from a group consisting of Si, Ge, and a combination thereof, and a binary compound selected from SiC, SiGe, and a combination thereof, but is not limited thereto.

Examples of the group compound include, but are not limited to, CuInSe2, CuInS2, CuInGaSe, and CuInGaS. Examples of the group I-II-IV-VI compound include, but are not limited to, CuZnSnSe and CuZnSnS. The group IV element or compound is a single element compound selected from a group consisting of Si, Ge, and a mixture thereof; and a binary compound selected from SiC, SiGe, and a mixture thereof, but embodiments are not limited thereto.

The group compound may be selected from a group consisting of ZnGaS, ZnAlS, ZnInS, ZnGaSe, ZnAlSe, ZnInSe, ZnGaTe, ZnAlTe, ZnInTe, ZnGaO, ZnAlO, ZnInO, HgGaS, HgAlS, HgInS, HgGaSe, HgAlSe, HgInSe, HgGaTe, HgAlTe, HgInTe, MgGaS, MgAlS, MgInS, MgGaSe, MgAlSe, MgInSe, and a combination thereof, but embodiments are not limited thereto.

The group I-II-IV-VI compound may be selected from, but is not limited to, CuZnSnSe and CuZnSnS.

According to some embodiments, the quantum dot may not include cadmium. The quantum dot may contain semiconductor nanocrystals based on III-V compounds including indium and phosphorus. The group III-V compound may further include zinc. The quantum dot may include a semiconductor nanocrystal based on a group II-VI compound including a chalcogen element (e.g., sulfur, cell rhenium, tellurium, or a combination thereof) and zinc.

In the quantum dot, the above-mentioned binary compound, a ternary element compound and/or quaternary compound may exist in a particle at a uniform concentration, or may exist in the same particle because the concentration distribution is partially divided into different states. In addition, one quantum dot may have a core/shell structure surrounding another quantum dot. The interface between the core and the shell may have a concentration gradient in which the concentration of elements present in the shell decreases toward the center.

In some embodiments, a quantum dot may have a core-shell structure including a core containing the nanocrystals described above and a shell surrounding the core. The shell of the quantum dot may serve as a protective layer to maintain the semiconductor characteristic by preventing chemical denaturation of the core and/or as a charging layer to impart an electrophoretic characteristic to the quantum dot. The shell may be single-layered or multi-layered. The interface between the core and the shell may have a concentration gradient in which the concentration of elements present in the shell decreases toward the center. Examples of the shell of the quantum dot include a metal or non-metal oxide, a semiconductor compound, or a combination thereof.

For example, the metal or non-metal oxide may be a binary element compound $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, NiO, and the like, or a ternary element component such as $MgAl_2O_4$, $CoFe_2O_4$, $NiFe_2O_4$, $CoMn_2O_4$, and the like, but the present invention is not limited thereto.

In addition, the semiconductor compound may be CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, and the like, but the present invention is not limited thereto.

The interface between the core and the shell may have a concentration gradient in which the concentration of elements present in the shell decreases toward the center. In addition, the semiconductor nanocrystal may have a structure including one semiconductor nanocrystal core and a multi-layered shell surrounding the semiconductor nanocrystal core. In one implementation, the multi-layered shell may have two or more layers, for example, two, three, four, five, or more layers. Two adjacent layers of the shell may have a single composition or a different composition. In a multi-layered shell, each layer may have a composition that varies along the radius thereof.

The quantum dot may have a full width of a half maximum (FWHM) of a light emitting wavelength spectrum of about 45 nm or less, for example (or preferably in some embodiments), about 40 nm or less, or for example (or more preferably in some embodiments), about 30 nm or less, and within this range, color purity or color reproducibility can be improved. In addition, light emitted through such a quantum dot is emitted in all directions, and accordingly, a light viewing angle can be improved.

In the quantum dot, the shell material and the core material may have different energy bandgaps. For example, the energy bandgap of the shell material may be greater than that of the core material. In other embodiments, the energy bandgap of the shell material may be smaller than that of the core material. The quantum dot may have a multi-layered shell. In a multi-layered shell, the energy bandgap of the outer layer may be larger than the energy bandgap of the inner layer (i.e., a layer closer to the core). In the multi-layered shell, the energy bandgap of the outer layer may be smaller than the energy bandgap of the inner layer.

The quantum dot may control an absorption/light emitting wavelength by controlling composition and size. The maximum light emitting peak wavelength of the quantum dot may have a wavelength range of ultraviolet (UV) to infrared wavelengths or higher.

The quantum dot may contain an organic ligand (e.g., having a hydrophobic moiety and/or a hydrophilic moiety). The organic ligand moiety may be bound to the surface of the quantum dot. The organic ligand may include RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, where R denotes each independently a substituted or unsubstituted C3 to C40 (e.g., C5 or more and C24 or less), an aliphatic hydrocarbon group such as substituted or unsubstituted alkyl of C3 to C40, a substituted or unsubstituted alkenyl, and the like, a substituted or unsubstituted C6 to C40 (e.g., C6 or more and C20 or less) aromatic hydrocarbon group such as a substituted or an unsubstituted aryl group or a combination thereof.

Examples of the organic ligand may include a thiol compound such as methane thiol, ethane thiol, propane thiol, butane thiol, pentane thiol, hexane thiol, octane thiol, dodecane thiol, hexadecane thiol, octadecane thiol, benzyl thiol; amines such as methanamine, ethanamine, propane amine, butanamine, pentylamine, hexylamine, octylamine, nonylamine, decylamine, dodecylamine, hexadecylamine, octadecylamine, dimethylamine, diethylamine, dipropylamine, tributylamine and trioctylamine; a carboxylic acid compound such as methanic acid, ethanoic acid, propane acid, butanoic acid, pentanoic acid, hexanoic acid, heptanoic acid, octanoic acid, dodecanoic acid, hexadecanoic acid, octadecanoic acid, oleic acid, and benzoic acid; a phosphine compounds such as methyl phosphine, ethyl phosphine, propyl phosphine, butyl phosphine, pentyl phosphine, octyl phosphine, dioctyl phosphine, tributyl phosphine, trioctyl phosphine, and the like; a phosphine compound such as methyl phosphine oxide, ethyl phosphine oxide, propyl phosphine oxide, butyl phosphine oxide, pentyl phosphine oxide, tributyl phosphine oxide, octyl phosphine oxide, dioctyl phosphine oxide, trioctyl phosphine oxide, or an oxide compound thereof; diphenyl oxide, triphenyl oxide compound, or an oxide compound thereof; and C5 to C20 alkyl phosphinic acid such as hexyl phosphonic acid, octyl phosphonic acid, dodecane phosphonic acid, tetradecane phosphonic acid, hexadecane phosphonic acid, and octadecane phosphonic acid, C5 to C20 alkyl phosphonic acid, and the like, but this is not restrictive. The quantum dot may contain a hydrophobic organic ligand alone or as a mixture of one or more types. The hydrophobic organic ligand may not contain a photopolymerizable moiety (e.g., an acrylate group, a methacrylate group, etc.).

A second insulation layer P2 may be positioned on the first color conversion layer CCL1, the second color conversion layer CCL2, and the transmissive layer CCL3. The second insulation layer P2 protects the first color conversion layer CCL1, the second color conversion layer CCL2, and the transmissive layer CCL3 by covering them, and thus inflow of foreign particles into the first color conversion layer CCL1, the second color conversion layer CCL2, and the transmissive layer CCL3 can be prevented. The second insulation layer P2 may be a single layer or multi-layered including at least one of a silicon oxide (SiOx), a silicon nitride (SiNx), or a silicon oxynitride (SiOxNy).

A third insulation layer P3 may be positioned on the second insulation layer P2. The third insulation layer P3 may be formed to overlap a front surface of the pixel portion PP. The third insulation layer P3 may overlap the first color conversion layer CCL1, the second color conversion layer CCL2, the transmissive layer CCL3, and the first light blocking layer BM1. The third insulation layer P3 may include organic or inorganic materials.

A fourth insulation layer P4 may be positioned on the third insulation layer P3. The fourth insulation layer P4 may be a single layer or multi-layered including at least one of a silicon oxide (SiOx), a silicon nitride (SiNx), or a silicon oxynitride (SiOxNy).

Depending on embodiments, at least one of the second insulation layer P2, the third insulation layer P3, or the fourth insulation layer P4 may be omitted.

A first color filter CF1, a second color filter CF2, and a third color filter CF3 may be positioned on an upper surface of the fourth insulation layer P4.

The first color filter CF1 transmits the red light that has passed through the first color conversion layer CCL1 and absorbs the light of the remaining wavelength, thereby increasing the purity of the red light emitted to the outside of the display device.

The second color filter CF2 transmits the green light that has passed through the second color conversion layer CCL2 and absorbs the light of the remaining wavelength, thereby increasing the purity of the green light emitted to the outside of the display device.

The third color filter CF3 transmits the blue light that has passed through the transmissive layer CCL3 and absorbs the light of the remaining wavelength, thereby increasing the purity of the blue light emitted to the outside of the display device.

The display panel according to some embodiments may include a first pixel area PX1 overlapping the first color filter CF1 and the first color conversion layer CCL1, a second pixel area overlapping the second color filter CF2, the second color conversion layer CCL2, and a third pixel area PX3 overlapping the third color filter CF3 and the transmissive layer CCL3.

A first light blocking area BA1 may be positioned between the first pixel area PX1 and the second pixel area PX2, between the second pixel area PX2 and the third pixel area PX3, and between the third pixel area PX3 and the first pixel area PX1. The first light blocking area BA1 may overlap the first light blocking layer BM1.

In the first light blocking area BA1, the first color filter CF1, the second color filter CF2, and the third color filter CF3 may overlap each other. The color converter CC according to some embodiments may provide a light blocking area that blocks light as a plurality of color filters overlap without a separate light blocking member.

Figure 9:
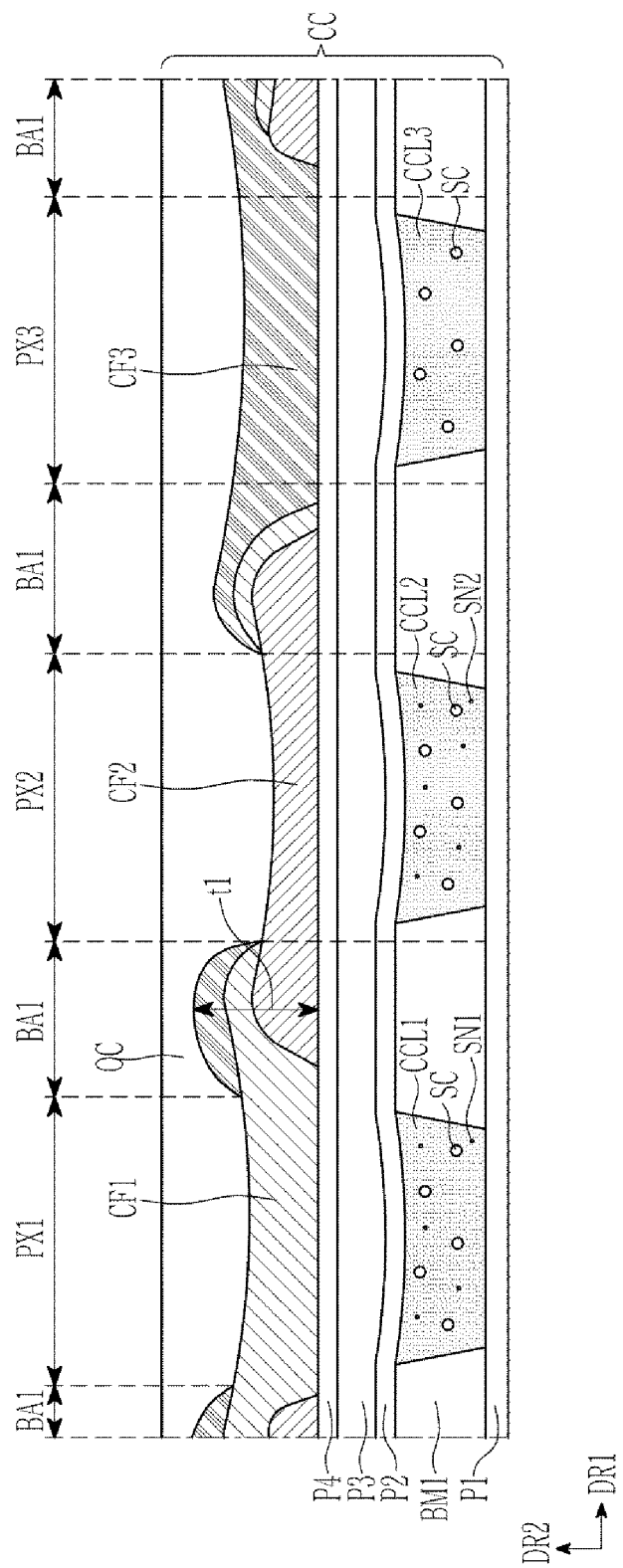
FIG. 9 is a cross-sectional view of FIG. 5, taken along the line A-A', according to some embodiments.
Figure 10:
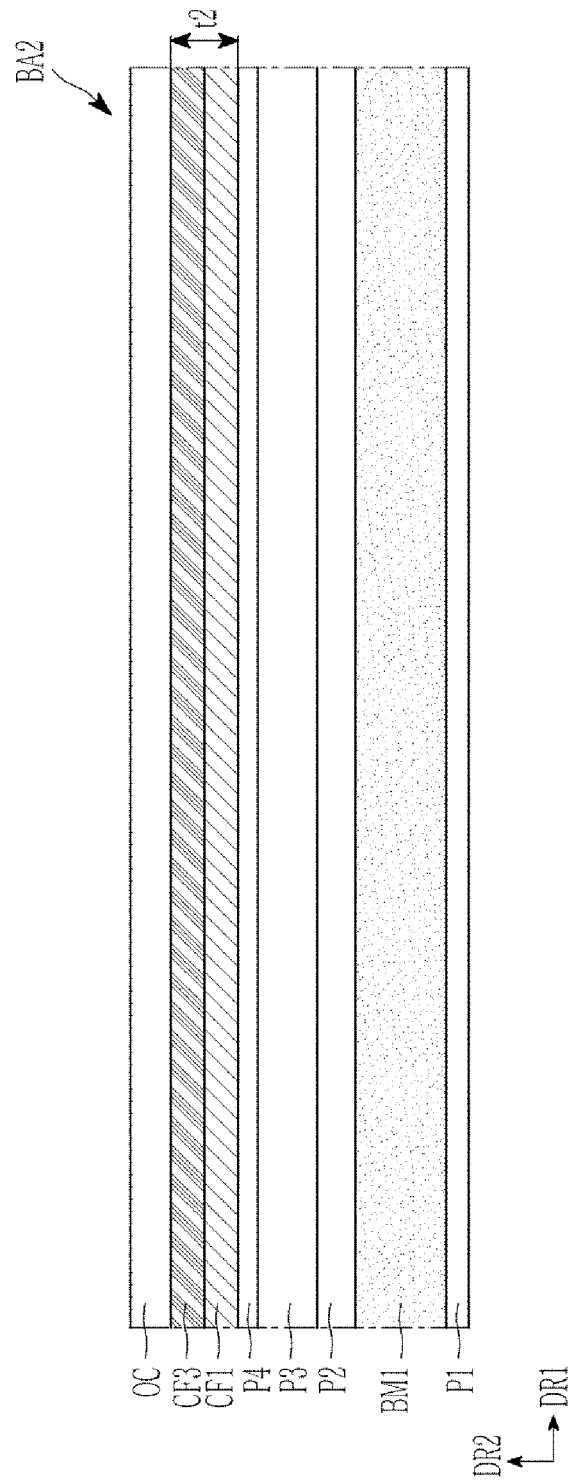
FIG. 10 is a cross-sectional view of FIG. 5, taken along the line B-B', according to some embodiments.

Hereinafter, a pixel area and a light blocking area according to some embodiments will be described in more detail with reference to FIG. 5 to FIG. 10. FIG. 5, FIG. 6, FIG. 7, and FIG. 8 are top plan views of color filters according to some embodiments, respectively, FIG. 9 is a cross-sectional view of FIG. 5, taken along the line A-A', and FIG. 10 is a cross-sectional view of FIG. 5, taken along the line B-B'. A description of the above-described constituent element and the same constituent element may be omitted.

Figure 5:
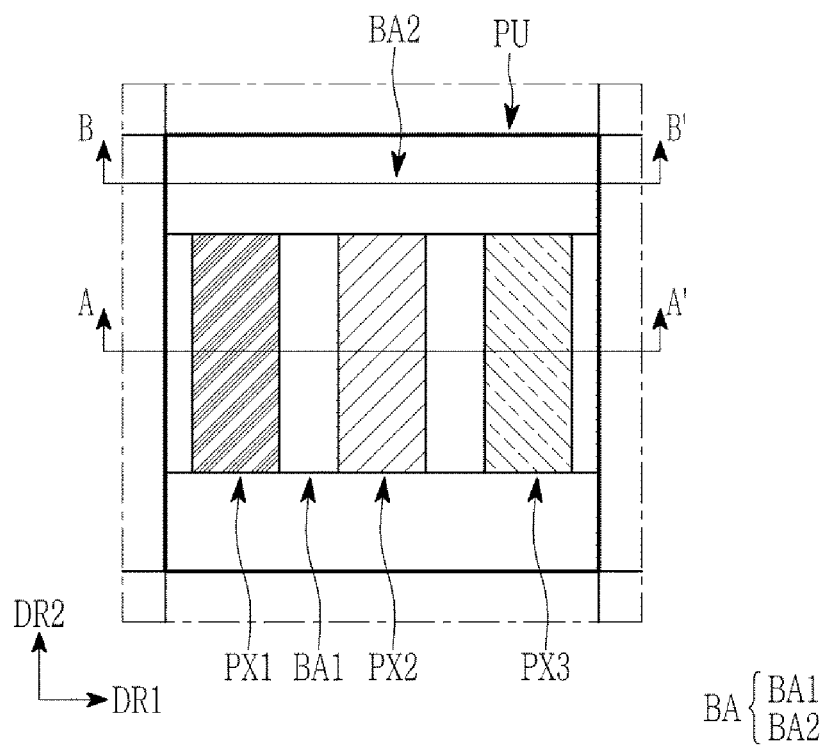
FIG. 5, FIG. 6, FIG. 7 and FIG. 8 are top plan views of color filters according to some embodiments, respectively.

First, referring to FIG. 5, a display panel according to some embodiments may include a plurality of unit pixel areas PU. The plurality of unit pixel areas PU may be repeatedly arranged along a first direction DR1 and a second direction DR2.

The unit pixel areas PU may include pixel areas PX1, PX2, and PX3 and a light blocking area BA. One unit pixel areas PU may include a first pixel area PX1 emitting light representing a first color, a second pixel area PX2 emitting light representing a second color, and a third pixel area PX3 emitting light representing a third color. The light blocking area BA may include a first light blocking area BA1 and a second light blocking area BA2. For example, in unit pixel areas PU, an area occupied by the pixel areas PX1, PX2, and PX3 may be in a range of 30% to 40% of the entire unit pixel area, and an area occupied by the light blocking areas BA1 and BA2 may be in a range of 60% to 70%.

Depending on embodiments, the unit pixel areas PU may include at least one or more of the first light blocking areas BA1 and the second light blocking areas BA2. The unit pixel area PU according to some embodiments may include four first light blocking areas BA1 and two second light blocking areas BA2.

A first light blocking area BA1, a first pixel area PX1, a first light blocking area BA1, a second pixel area PX2, a first light blocking area BA1, a third pixel area PX3, and a first light blocking area BA1 may be arranged along the first direction DR1. In addition, a second light blocking area BA2, a first light blocking area BA1, and a second light blocking area BA2 may be arraned along the second direction DR2, or the second light blocking area BA2 and one of the pixel areas PX1, PX2, and PX3 and the second light blocking area BA2 may be arranged. Such an alignment may vary according to various embodiments, but embodiments according to the present disclosure are not limited thereto.

According to some embodiments, an area of the first light blocking area BA1 and an area of the second light blocking area BA2 may be different from each other. Specifically, the area of the first light blocking area BA1 may be smaller than the area of the second light blocking area BA2. The first light blocking area BA1 may be between the first pixel area PX1 and the second pixel area PX2 and between the second pixel area PX2 and the third pixel area PX3 that are adjacent to each other, or a first pixel area PX1 and a third pixel area PX3 that are located in different unit pixel areas PU. The second light blocking area BA2 is a region in the unit pixel areas PU except for the pixel areas PX1, PX2, and PX3 and the first light blocking area BA1, and may have a relatively larger planar area than the first light blocking area BA1.

The second light blocking area BA2 positioned in adjacent unit pixel areas PU may be connected to each other. The second light blocking areas BA2 positioned adjacently along the first direction DR1 may be connected to each other and may have a stripe shape.

Hereinafter, a color filter located on the unit pixel areas PU will be described in more detail.

Figure 6:
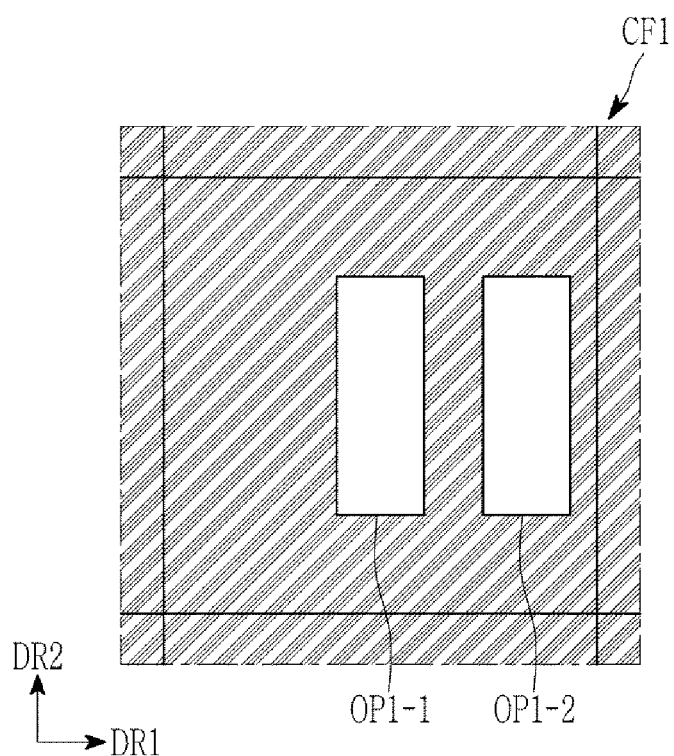

Referring to FIG. 6 in addition to the above-described drawings, the first color filter CF1 according to some embodiments may overlap the first pixel area PX1, and may include a 1-1 opening OP1-1 overlapping the second pixel area PX2 and a 1-2 opening OP1-2 overlapping the third pixel area PX3. The first color filter CF1 may overlap the first pixel area PX1, the first light blocking area BA1, and the second light blocking area BA2. The first color filter CF1 may be distanced from the second pixel area PX2 and the third pixel area PX3 without being overlapped.

Figure 7:
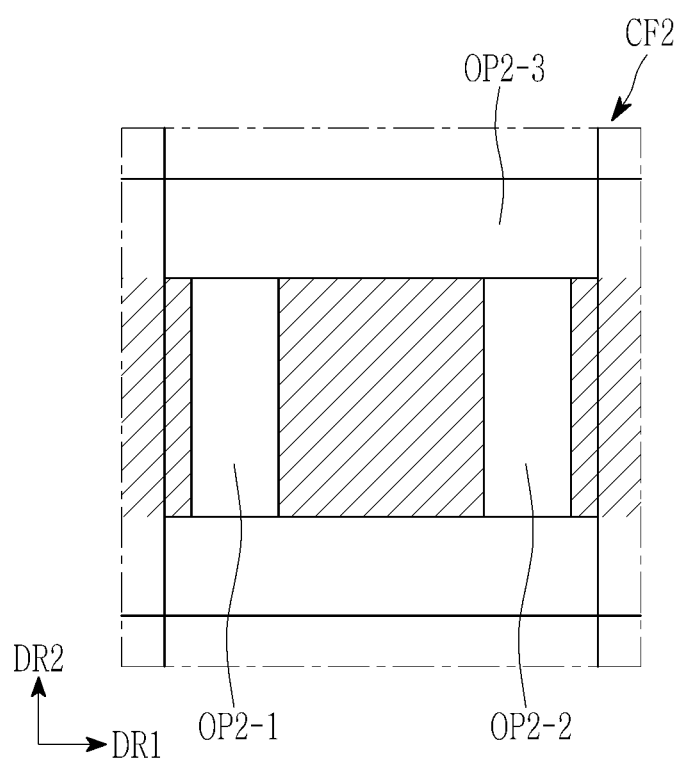

Referring to FIG. 7, the second color filter CF2 according to some embodiments may overlap the second pixel area PX2. In addition, the second color filter CF2 may overlap the first light blocking area BA1. Further, the second color filter CF2 may not overlap the first pixel area PX1, the third pixel area PX3, and the second light blocking area BA2. The second color filter CF2 may be spaced apart from the first pixel area PX1, the third pixel area PX3, and the second light blocking area BA2.

The second color filter CF2 may include a 2-1 opening OP2-1 overlapping the first pixel area PX1$m$ a 2-2 opening OP2-2 overlapping the third pixel area PX3, and a 2-3 opening OP2-3 overlapping the second light blocking area BA2.

Figure 8:
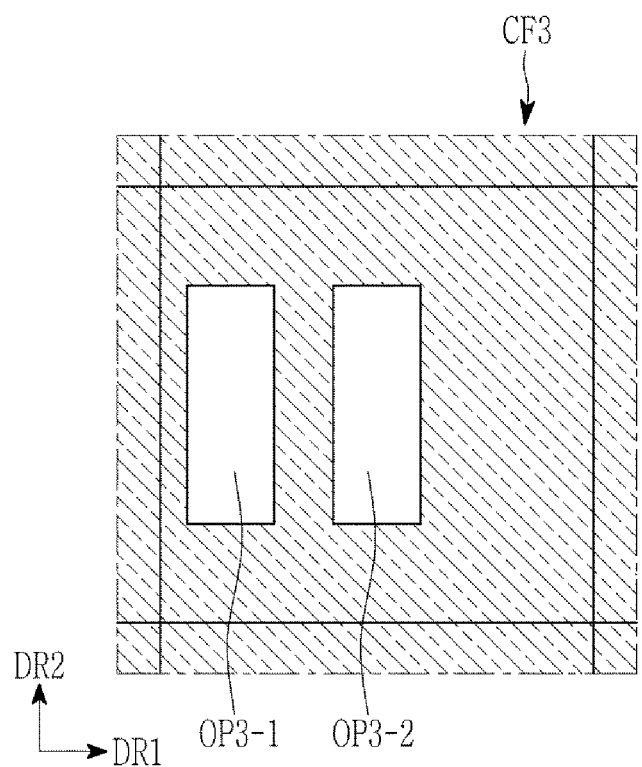

Referring to FIG. 8, the third color filter CF3 according to some embodiments may overlap the third color filter CF3. In addition, the third color filter CF3 may overlap the first light blocking area BA1 and the second light blocking area BA2. Further, the third color filter CF3 may not overlap the first pixel area PX1 and the second pixel area PX2. The third color filter CF3 may be spaced apart from the first pixel area PX1 and the second pixel area PX2.

The third color filter CF3 may include a 3-1 opening OP3-1 overlapping the first pixel area PX1 and a 3-2 opening OP3-2 overlapping the second pixel area PX2.

In addition to the above-described contents, a cross-section will be described with reference to FIG. 9 and FIG. 10. The description of the constituent elements described above with reference to FIG. 4 may be omitted. Hereinafter, the configuration of the color filter will be described in more detail.

Referring to FIG. 9, the first color filter CF1 may be positioned in the first pixel area PX1. The second color filter CF2 may be positioned in the second pixel area PX2. The third color filter CF3 may be positioned in the third pixel area PX3.

In one unit pixel area, the first light blocking area BA1 may be positioned between adjacent first and second pixel areas PX1 and PX2 and between adjacent second and third pixel areas PX2 and PX3. In addition, the first light blocking area BA1 may be positioned between the first pixel area PX1 and the third pixel area PX3 between adjacent unit pixel areas.

The first color filter CF1, the second color filter CF2, and the third color filter CF3 may be positioned in the first light blocking area BA1. The first light blocking area BA1 may provide a light blocking area by overlapping a plurality of color filters without a separate light blocking member.

Next, referring to FIG. 10, a region excluding the first light blocking area BA1, the first pixel area PX1, the second pixel area PX2, and the third pixel area PX3 within one unit pixel area is referred to as a second light blocking area BA2.

The second light blocking area BA2 is a region where a separate color conversion layer is not positioned, and in the second light blocking area BA2, a first insulation layer P1, a first light blocking layer BM1, a second insulation layer P2, a third insulation layer P3, and a fourth insulation layer P4 are stacked.

The first color filter CF1 and the third color filter CF3 may be positioned on the fourth insulation layer P4. The first color filter CF1 and the third color filter CF3 may overlap the second light blocking area BA2.

The first color filter CF1, the second color filter CF2, and the third color filter CF3 may be positioned in the first light blocking area BA1, and the first color filter CF1 and the third color filter CF3 may be positioned in the second light blocking area BA2. In the second light blocking area BA2, a sufficient light blocking function may be performed only by overlapping the first color filter CF1 and the third color filter CF3.

A thickness t1 of the first light blocking area BA1 may be greater than a thickness t2 of the second light blocking area BA2. Because the first light blocking area BA1 is positioned between the pixel areas PX1, PX2, and PX3, a sufficient thickness may be required to prevent color mixing between the pixel areas PX1, PX2, and PX3. In the second light blocking area BA2, there are few color mixing issues, and thus it can be provided with a relatively thin thickness.

An overcoat layer OC may be positioned on the color filters CF1, CF2, and

CF3. The overcoat layer OC may be formed to overlap the entire surface of the substrate SUB. The overcoat layer OC may include an organic material and may provide a planarized top surface.

When the color filters CF1, CF2, and CF3 have large step differences, the overcoat layer OC may also be formed to have a large step difference. However, according to some embodiments, because the second light blocking area BA2 having a relatively large area has a smaller thickness than the first light blocking area BA1, the step difference of the overcoat layer OC may be alleviated. According to some embodiments, the flatness of the overcoat layer OC may be improved. Because a cover window located on the overcoat layer OC may be stably coupled, it may be possible to provide a display device with improved reliability.

According to some embodiments, the display device may be manufactured by sequentially forming the second color filter CF2, the first color filter CF1, and the third color filter CF3 on the fourth insulation layer P4. The order of the second color filter CF2, the first color filter CF1, and the third color filter CF3 may be changed.

In this case, the first color filter CF1 may be formed in the form shown in FIG. 6, the second color filter CF2 may be formed in the form shown in FIG. 7, and the third color filter CF3 may be formed in the form shown in FIG. 8. Through lamination of the first to third color filters CF1, CF2, and CF3, the laminate structure according to FIG. 10 may be provided.

Figure 11:
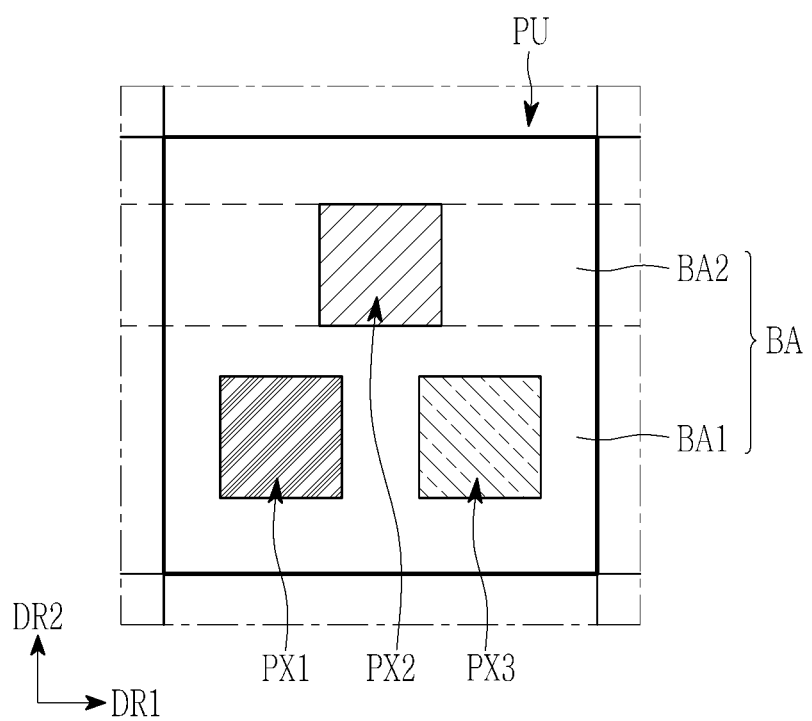
FIG. 11, FIG. 12, FIG. 13, FIG. 14 are top plan views of a color filter according to some embodiments.
Figure 12:
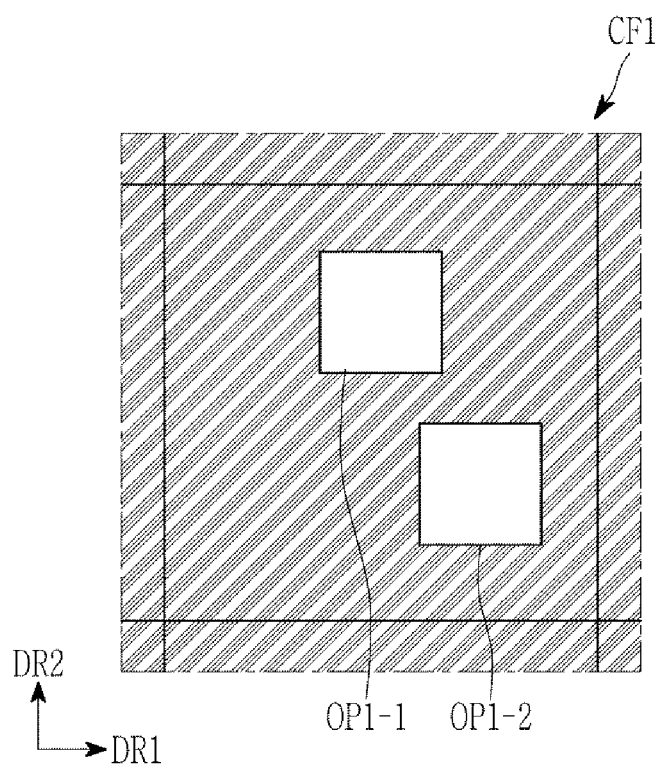
Figure 13:
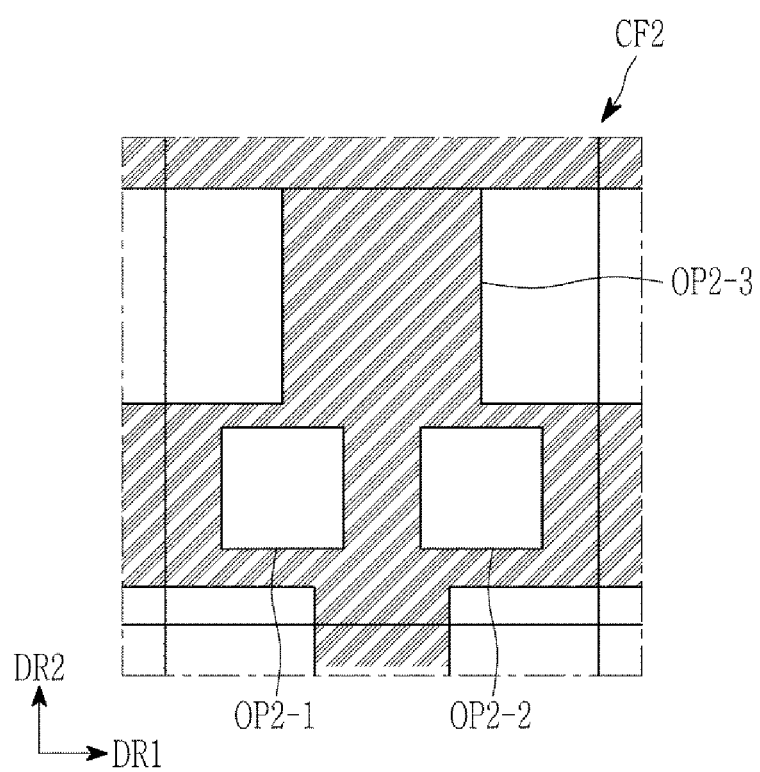
Figure 14:
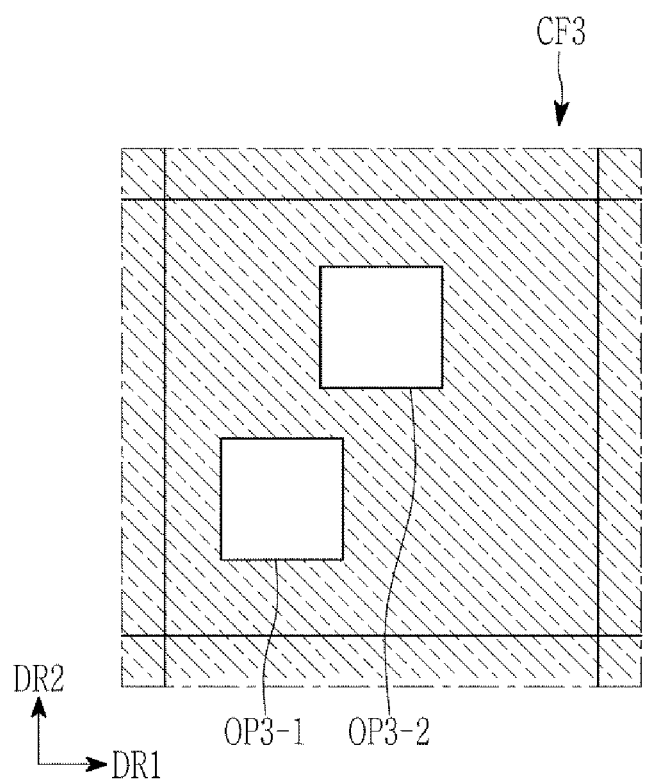

Hereinafter, a unit pixel area according to some embodiments will be described with reference to FIG. 11 to FIG. 14. FIG. 11 is a top plan view of a unit pixel area according to some embodiments, FIG. 12 is a top plan view of a first color filter according to some embodiments, FIG. 13 is a top plan view of a second color filter according to some embodiments, and FIG. 14 is a top plan view of a third color filter according to some embodiments. A description of the above-described constituent element and the same constituent elements may be omitted.

Referring to FIG. 11, a unit pixel areas PU may include a first pixel area PX1, a second pixel area PX2, a third pixel area PX3, a first light blocking area BA1, and a second light blocking area BA2.

The first light blocking area BA1 may be positioned between adjacent first and second pixel areas PX1 and PX2, between the second and third pixel areas PX2 and PX3, and between the third and first pixel areas PX3 and PX1. Alternatively, the first light blocking area BA1 may be positioned between boundary pixel areas PX1, PX2, and PX3 of the unit pixel areas PU. According to various embodiments, the first light blocking area BA1 may be connected to or spaced apart from each other within the unit pixel areas PU.

The first color filter CF1, the second color filter CF2, and the third color filter CF3 may be positioned in the first light blocking area BA1. The first light blocking area BA1 may provide a light blocking area by overlapping a plurality of color filters without a separate light blocking member.

The second light blocking area BA2 may be a region other than the first light blocking area BA1 and the pixel areas PX1, PX2, and PX3 within the unit pixel areas PU. The second light blocking area BA2 may be connected to another second light blocking area BA2 included in the adjacent unit pixel areas PU, but the shape and alignment are not limited thereto. The shape and position of the first light blocking area BA1 and the second light blocking area BA2 may be changed according to the alignment of the pixel areas PX1, PX2, and PX3.

As shown in FIG. 11, the second light blocking area BA2 may be adjacent to the second pixel area PX2. The second light blocking area BA2, the second pixel area PX2, and the second light blocking area BA2 may be repeatedly arranged along a first direction DR1.

Referring to FIG. 12 in addition to the above-described drawings, the first color filter CF1 according to some embodiments may overlap the first pixel area PX1, and may include a 1-1 opening OP1-1 overlapping the second pixel area PX2 and a 1-2 opening OP1-2 overlapping the third pixel area PX3. The first color filter CF1 may overlap the first pixel area PX1, the first light blocking area BA1, and the second light blocking area BA2. The first color filter CF1 may be spaced apart from each other while not overlapping the second pixel area PX2 and the third pixel area PX3.

Referring to FIG. 13, the second color filter CF2 according to some embodiments may include the second pixel area PX2. In addition, the second color filter CF2 may overlap the first light blocking area BA1. In addition, the second color filter CF2 may not overlap the first pixel area PX1, the third pixel area PX3, and the second light blocking area BA2. The second color filter CF2 may be spaced apart from the first pixel area PX1, the third pixel area PX3, and the second light blocking area BA2.

The second color filter CF2 may include a 2-1 opening OP2-1 overlapping the first pixel area PX1, a 2-2 opening OP2-2 overlapping the third pixel area PX3 and a 2-3 opening OP2-3 overlapping the second light blocking area BA2.

Referring to FIG. 14, the third color filter CF3 according to some embodiments may overlap the third pixel area PX3. In addition, the third color filter CF3 may overlap the first light blocking area BA1 and the second light blocking area BA2. In addition, the third color filter CF3 may not overlap the first pixel area PX1 and the second pixel area PX2. The third color filter CF3 may be spaced apart from the first pixel area PX1 and the second pixel area PX2.

The third color filter CF3 may include a 3-1 opening OP3-1 overlapping the first pixel area PX1 and a 3-2 opening OP3-2 overlapping the second pixel area PX2.

A cross-section according to the embodiments of FIG. 11 to FIG. 14 is the same as the cross-section of FIG. 9 and FIG. 10, and therefore some description thereof may be omitted below. The embodiments of FIG. 11 to FIG. 14 are different from the embodiments of FIG. 5 to FIG. 8 in alignment and shape of first to third pixel areas and alignment and shape of first and second light blocking areas. It is not limited to the embodiments shown in the present specification, but the alignment and shape of the pixel area and light blocking area may be variously modified and the above-described embodiments may be applied.

A comparative example and the embodiments will be described with reference to the following Table 1. A comparative example includes a first light blocking area and a second light blocking area where first color filter to third color filter all overlap. According to some embodiments, the first color filter to the third color filter overlaps in the first light blocking area, and the first color filter and the third color filter overlap in the second light blocking area.

Referring to Table 1, according to some embodiments, even when only the first color filter and the third color filter overlap in the second light blocking area, the light efficiency, reflectance, reflection color, color matching rate, and WAD showed almost the same level as the comparative example.

TABLE 1

| | Comparative Example | Embodiment |
|---|---|---|
| Light efficiency | 100% | 99.97% |
| Reflectance (SCI/SCE) | 1.125%/0.637% | 1.125%/0.637% |
| Reflection color | 0.292/0.286 | 0.292/0.286 |
| Color matching rate | 90.18% | 90.17% |
| WAD | 0.01 | 0.01 |

In addition, according to some embodiments, it was confirmed that the overlapping thickness of the color filters in the second light blocking area can be reduced by about 2 micrometers or more compared to the overlapping thickness of the color filters in the first light blocking area. The display device according to some embodiments can improve the flatness of the overcoat layer formed on the upper part of the display panel by reducing the thickness of the second light blocking area. Accordingly, the cover window formed on the overcoat layer can be stably coupled. A display device with relatively improved reliability and quality can therefore be provided.

While this invention has been described in connection with what is presently considered to be practical embodiments, it is to be understood that the invention is not limited to the disclosed embodiments. On the contrary, it is intended to cover various modifications and equivalent arrangements included within the spirit and scope of the appended claims.

| Description of Some of the Reference Symbols | |
|---|---|
| SUB: substrate | PX1: first pixel area |
| PX2: second pixel area | PX3: third pixel area |
| PU: unit pixel area | BA: light blocking area |
| BA1: first light blocking area | BA2: second light blocking area |
| CF1: first color filter | CF2: second color filter |
| CF3: third color filter | |

What is claimed is:

1. A display device comprising:
a unit pixel area including a first pixel area, a second pixel area, a third pixel area, and a light blocking area on a substrate,
wherein the light blocking area comprises a first light blocking area and a second light blocking area,
the first pixel area comprises:
   a first color conversion layer on a light emitting element; and
   a first color filter on the first color conversion layer,
the second pixel area comprises:
   a second color conversion layer on the light emitting element; and
   a second color filer on the second color conversion layer,
the third pixel area comprises:
   a transmissive layer on the light emitting element; and
   a third color filter on the transmissive layer,
the first light blocking area overlaps the first color filter, the second color filter, and the third color filter, and
the second light blocking area overlaps two color filters selected from the first color filter, the second color filter, and the third color filter.

2. The display device of claim 1, wherein in the unit pixel area,
an area occupied by the first light blocking area is smaller than an area occupied by the second light blocking area.

3. The display device of claim 2, wherein
the first light blocking area is between the first pixel area and the second pixel area adjacent to each other and between the second pixel area and the third pixel area that are adjacent to each other in the unit pixel area.

4. The display device of claim 2, wherein the first pixel area, the second pixel area, and the third pixel area are arranged along a first direction.

5. The display device of claim 4, wherein the unit pixel area comprises at least two second light blocking areas, and
the second light blocking area, the first pixel area, and the second light blocking area are arranged along a second direction.

6. The display device of claim 1, wherein the first color filter comprises an opening that overlaps the second pixel area and the third pixel area.

7. The display device of claim 1, wherein the second color filter comprises:
a 2-1 opening overlapping the first pixel area;
a 2-2 opening overlapping the third pixel area; and
a 2-3 opening overlapping the second light blocking area.

8. The display device of claim 1, wherein the third color filter comprises an opening that overlaps the first pixel area and the second pixel area.

9. The display device of claim 1, wherein a thickness of the first light blocking area is different from a thickness of the second light blocking area.

10. The display device of claim 9, wherein a thickness of the first light blocking area is larger than a thickness of the second light blocking area.

11. The display device of claim 1, wherein the display device further comprises
an overcoat layer that is on the first color filter, the second color filter, and the third color filter, and
a cover window that is on the overcoat layer.

* * * * *